United States Patent
Reynov et al.

(10) Patent No.: US 10,076,033 B1
(45) Date of Patent: Sep. 11, 2018

(54) PRINTED CIRCUIT BOARD WITH CONNECTOR HEADER MOUNTED TO BOTTOM SURFACE

(71) Applicant: Juniper Networks, Inc., Sunnyvale, CA (US)

(72) Inventors: Boris Reynov, Cupertino, CA (US); Shreeram Siddhaye, Sunnyvale, CA (US); Venkata S. Raju Penmetsa, Sunnyvale, CA (US); Jack W. Kohn, Mountain View, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/388,021

(22) Filed: Dec. 22, 2016

(51) Int. Cl.
*H05K 1/11* (2006.01)
*H05K 1/18* (2006.01)
*H05K 1/02* (2006.01)
*H01R 12/58* (2011.01)

(52) U.S. Cl.
CPC .......... *H05K 1/115* (2013.01); *H01R 12/585* (2013.01); *H05K 1/0251* (2013.01); *H05K 1/181* (2013.01); *H05K 2201/10287* (2013.01); *H05K 2201/10303* (2013.01); *H05K 2201/10734* (2013.01)

(58) Field of Classification Search
CPC ...... H05K 1/115; H05K 1/0251; H05K 1/181; H01R 12/585
USPC ....................................................... 361/767
See application file for complete search history.

(56) References Cited

U.S. PATENT DOCUMENTS

| 4,315,321 | A  | * | 2/1982 | Parks | .................... | G06F 9/3017 |
| | | | | | | 703/26 |
| 5,767,575 | A  |   | 1/1998 | Lan et al. | | |
| 5,859,538 | A  |   | 1/1999 | Self | | |
| 5,906,042 | A  |   | 5/1999 | Lan et al. | | |
| 6,386,429 | B1 | * | 5/2002 | Sani-Bakhtiari | ....... | B23K 1/008 |
| | | | | | | 228/180.1 |
| 6,399,417 | B1 |   | 6/2002 | Lee et al. | | |
| 6,719,573 | B2 | * | 4/2004 | Koehler | .............. | H01R 12/585 |
| | | | | | | 29/837 |
| 8,845,367 | B2 | * | 9/2014 | Gutierrez | .............. | H01F 27/027 |
| | | | | | | 439/620.01 |
| 2009/0034983 | A1 | * | 2/2009 | Shinoda | ............... | G02B 6/4246 |
| | | | | | | 398/141 |

(Continued)

FOREIGN PATENT DOCUMENTS

EP          1 085 571 A1    3/2001

*Primary Examiner* — Timothy Thompson
*Assistant Examiner* — Charles Pizzuto
(74) *Attorney, Agent, or Firm* — Harrity & Harrity, LLP

(57) ABSTRACT

An apparatus may include a printed circuit board, an integrated circuit mounted on a first surface of the printed circuit board, and one or more vias that extend through the printed circuit board from the first surface to a second surface of the printed circuit board to provide electrical connectivity for the integrated circuit. The second surface of the printed circuit board may be opposite the first surface of the printed circuit board. The apparatus may include a pin header that mechanically supports one or more pins that provide electrical connectivity for the integrated circuit. The pin header may be mounted to the second surface of the printed circuit board to mate the one or more pins with the one or more vias to provide electrical connectivity for the integrated circuit.

20 Claims, 3 Drawing Sheets

(56) References Cited

U.S. PATENT DOCUMENTS

2017/0079140 A1\* 3/2017 Enriquez Shibayama ................... H05K 1/184

\* cited by examiner

US 10,076,033 B1

PRINTED CIRCUIT BOARD WITH CONNECTOR HEADER MOUNTED TO BOTTOM SURFACE

BACKGROUND

A printed circuit board (PCB) mechanically supports and electrically connects electronic components using conductive tracks, pads, and/or other features etched from copper sheets laminated onto a non-conductive substrate. Components, such as capacitors, resistors, or other devices, are generally soldered onto the PCB. Advanced PCBs may contain components embedded in the substrate. A PCB may be single sided (e.g., having one copper layer), double sided (e.g., having two copper layers), or multi-layer (e.g., having outer and inner layers). Conductors on different layers are connected with vias. Multi-layer PCBs allow for much higher component density than single-layer PCBs.

SUMMARY

In some implementations, an apparatus may include a printed circuit board, an integrated circuit mounted on a first surface of the printed circuit board, and one or more vias that extend through the printed circuit board from the first surface to a second surface of the printed circuit board to provide electrical connectivity for the integrated circuit. The second surface of the printed circuit board may be opposite the first surface of the printed circuit board. The apparatus may include a pin header that mechanically supports one or more pins that provide electrical connectivity for the integrated circuit. The pin header may be mounted to the second surface of the printed circuit board to mate the one or more pins with the one or more vias to provide electrical connectivity for the integrated circuit.

In some implementations, an apparatus may include a printed circuit board having a first surface. The apparatus may include an array of vias that extend through the printed circuit board from the first surface to a second surface of the printed circuit board. The array of vias may provide electrical connectivity for an integrated circuit to be mounted to the first surface of the printed circuit board. The apparatus may include a connector header that mechanically supports a plurality of connectors. The connector header may be mounted to the second surface of the printed circuit board to mate the plurality of connectors with a corresponding plurality of vias, included in the array of vias, from the second surface of the printed circuit board. At least one of the plurality of connectors may provide electrical connectivity for the integrated circuit.

In some implementations, an apparatus may include a printed circuit board having a first surface for mounting an integrated circuit and a second surface opposite the first surface. The apparatus may include an array of vias to provide electrical connectivity for the integrated circuit. The array of vias may extend through the printed circuit board from the first surface to the second surface. The apparatus may include a connector header that mechanically supports a plurality of connectors. The connector header may be mounted to the second surface of the printed circuit board. The plurality of connectors may be mated with the array of vias to provide electrical connectivity for the integrated circuit.

DETAILED DESCRIPTION

The following detailed description of example implementations refers to the accompanying drawings. The same reference numbers in different drawings may identify the same or similar elements.

Printed circuit boards (PCBs) may include many components (e.g., electrical components), such as application specific integrated circuits (ASICs), field programmable gate arrays (FPGAs), busses, power supplies (e.g., power converters), integrated circuits, or the like. The complexity and operational requirements for PCBs can reduce the space available to place these components, and connections between the components, on the PCB. Due to these space constraints, the design of PCBs can be extremely complex and expensive, leading to greater design time and greater design cost and PCB cost.

For example, high speed communication links (e.g., with speeds of 25 gigabits per second and higher) in a traffic transfer device (e.g., a router, a switch, an optical add drop multiplexer, and/or the like) may require PCB materials with low attenuation to reduce signal loss over the communication links. Existing PCB materials (e.g., laminates) have higher attenuation than that required for high speed communication. To mitigate this attenuation, PCBs typically include multiple repeaters, re-timers, or other components along a path of a high speed communication link. Including these types of components on a PCB uses additional space, consumes additional power, introduces further design complexities, and increases PCB cost.

Implementations described herein include a connector header capable of being mounted to a bottom surface of a PCB to provide connectivity for components mounted to a top surface of the PCB. The connector header may include wires and/or cables that permit high speed communication of PCB components with lower attenuation than typical PCB materials. In this way, components used to mitigate attenuation of PCB materials may be excluded from the PCB, thereby increasing available space on the PCB, reducing PCB size, reducing PCB power consumption, simplifying PCB design, and reducing PCB cost. Furthermore, mounting the connector header to the bottom surface of the PCB reduces physical and/or electrical interference with components and/or other cables connected to the top surface of the PCB, thereby further increasing available space on the PCB, reducing PCB size, reducing PCB power consumption, simplifying PCB design, and reducing PCB cost.

Figure 1:
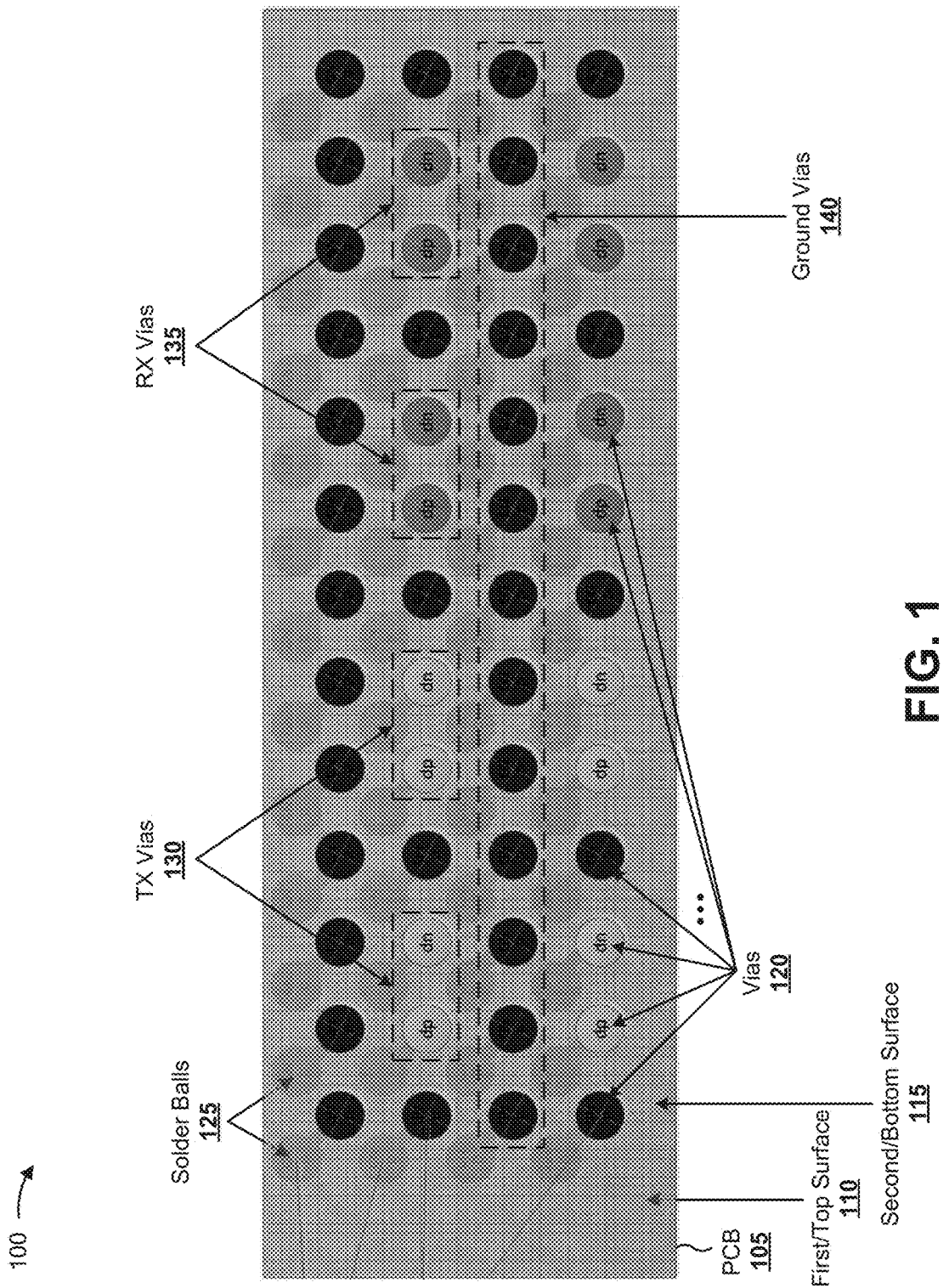
FIGS. 1-3 are diagrams of an example apparatus that includes a PCB and/or a connector header mounted to a bottom surface of the PCB.
Figure 2:
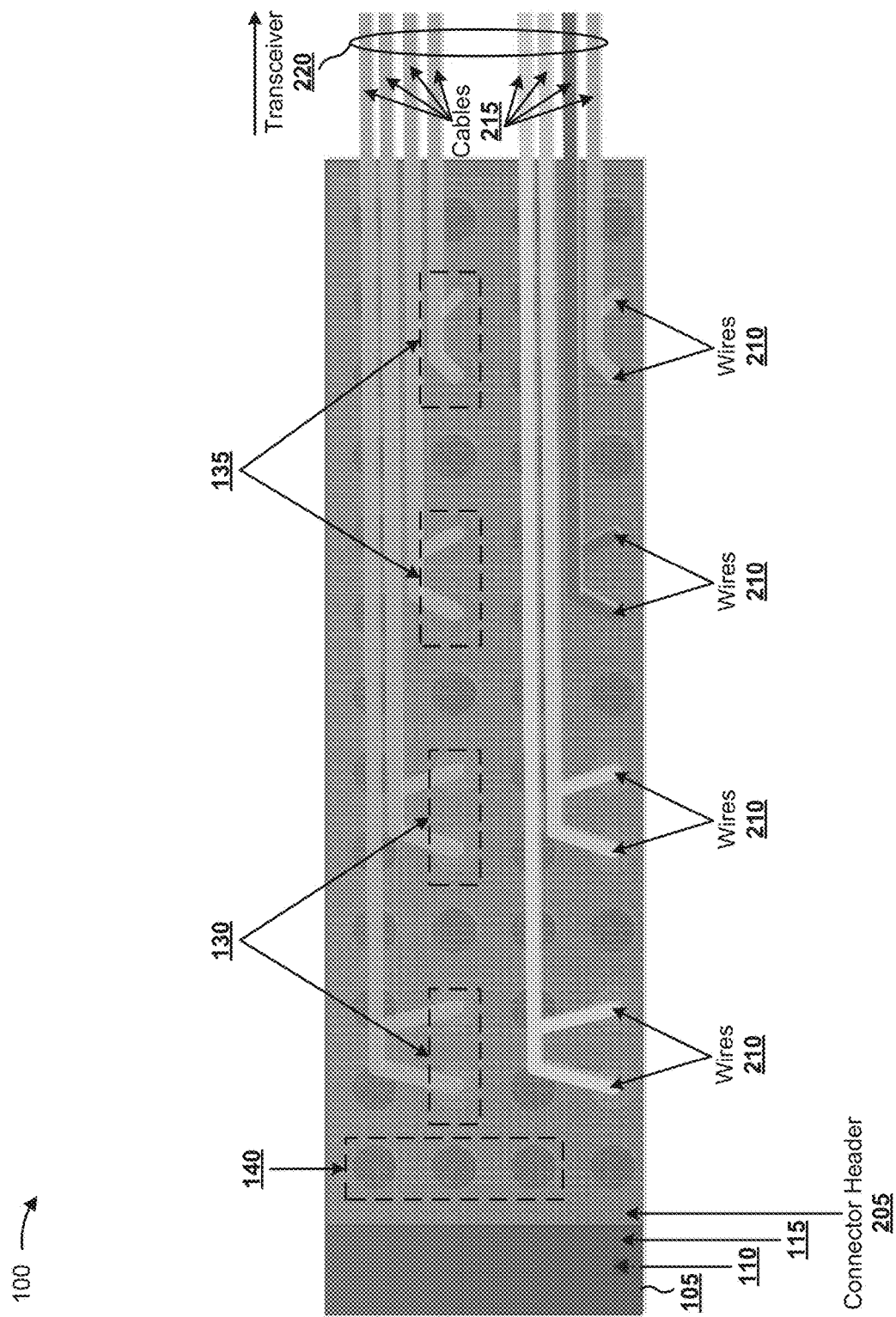
Figure 3:
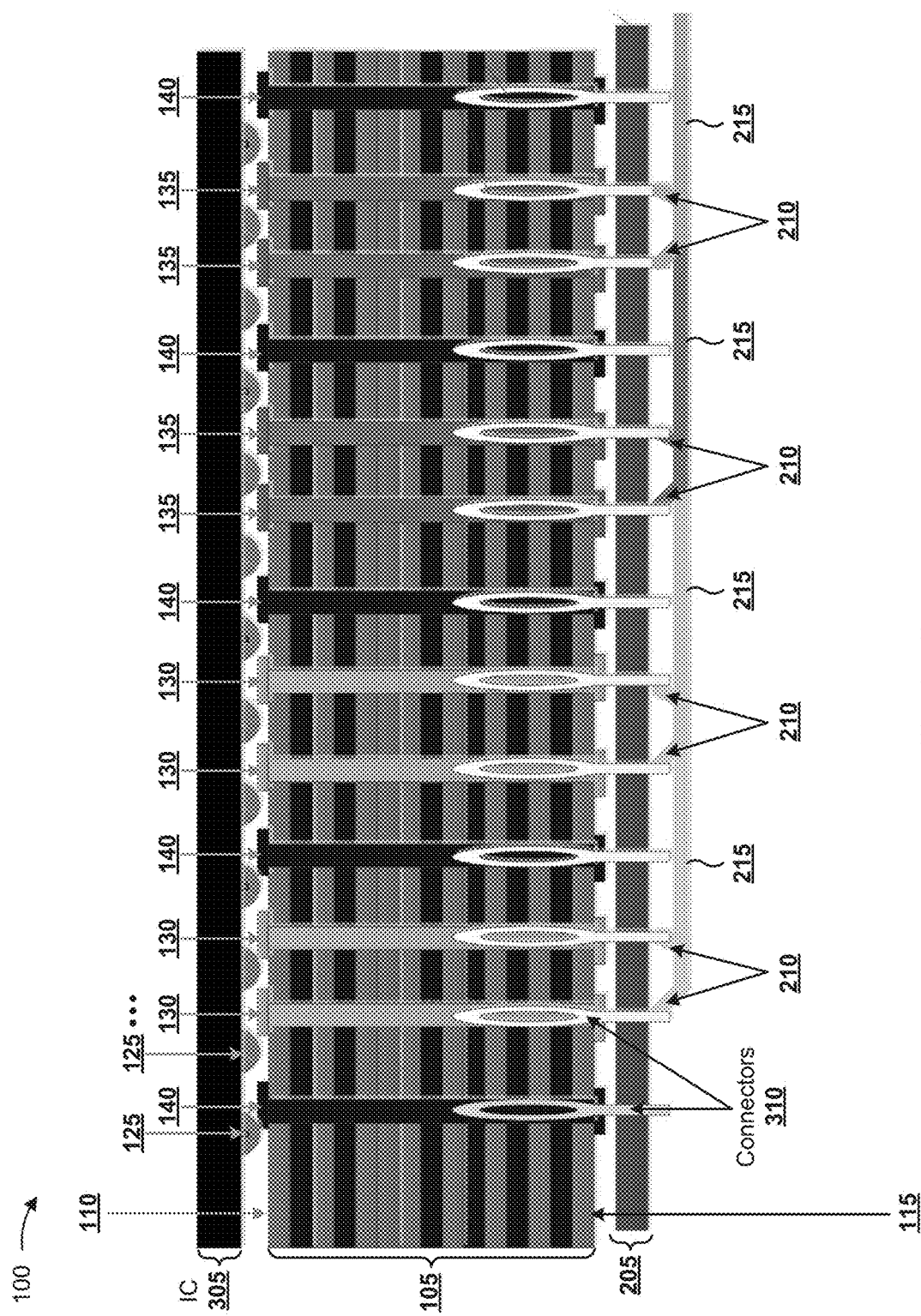

FIGS. 1-3 show different views of an example apparatus 100 that includes a PCB and/or a connector header that may be mounted to a bottom surface of the PCB. FIG. 1 shows a bottom view of apparatus 100 without the connector header mounted to the PCB. As shown in FIG. 1, apparatus 100 may include a PCB 105 with a first surface (e.g., a top surface) 110 and a second surface (e.g., a bottom surface) 115, a set of vias 120, and/or a set of solder balls 125. As further shown, the set of vias 120 may serve as a set of vias 130 connected to a corresponding set of transmitters (sometimes referred to as "TX vias 130" herein), a set of vias 135 connected to a corresponding set of receivers (sometimes referred to as "RX vias 135" herein), and/or a set of ground vias 140.

PCB 105 includes a substrate (e.g., a non-conductive substrate) that includes mechanical support for electronic components. Additionally, or alternatively, PCB 105 may include electrical connections for the electronic components using, for example, conductive tracks, pads, and/or other features etched from laminated sheets (e.g., copper sheets or sheets made from another conductive material). PCB 105 may include multiple layers, and conductors on different layers may be connected with vias 120. Additionally, or alternatively, PCB 105 may include a first surface 110 and a second surface 115 that is opposite the first surface 110 (e.g., located on an opposite or reverse side of PCB 105 as compared to first surface 110).

First surface 110 includes a surface of PCB 105 (e.g., a top surface) configured for mounting of one or more integrated circuits (e.g., one or more integrated circuits 305, described below in connection with FIG. 3). For example, an integrated circuit may be mounted on the first surface 110 of PCB 105. In some implementations, a mounting mechanism (e.g., solder, a set of solder balls 125, etc.) may be positioned on the first surface 110, and the integrated circuit may be mounted to the first surface 110 using the mounting mechanism.

Second surface 115 includes a surface of PCB 105 (e.g., a bottom surface) that is opposite from the first surface 110 of PCB 105. In some implementations, PCB 105 includes one or more layers (e.g., conductive layers, non-conductive layers, or a combination thereof) between the first surface 110 and the second surface 115. The second surface 115 of PCB 105 may be configured for mounting a connector header (e.g., a connector header 205, described below in connection with FIG. 2) that mechanically supports a set of connectors (e.g., a set of connectors 310, described below in connection with FIG. 3) that provide electrical connectivity for an integrated circuit mounted to the first surface 110 of PCB 105 (e.g., to provide a high speed communication link). Additional details regarding the connector header and the connectors are described elsewhere herein.

Via 120 provides an electrical connection between different layers and/or surfaces of PCB 105. For example, via 120 may include a hole, in PCB 105, that is plated with a conductive material to provide the electrical connection. In some implementations, via 120 may include a through via that extends entirely through PCB 105 from the first surface 110 to the second surface 115. In this way, via 120 may provide electrical connectivity for an integrated circuit mounted on the first surface 110 to a connector inserted into via 120. For example, the connector may be supported by a connector header mounted to the second surface 115 of PCB 105, and may provide electrical connectivity from the integrated circuit to a wire attached to the connector (e.g., a wire 210, described below in connection with FIG. 2). In some implementations, via 120 may include a dog bone connector. Additionally, or alternatively, via 120 may include a first pad on the first surface 110 and/or a second pad on the second surface 115. The first pad and the second pad may be electrically connected by a hole in PCB 105. In some implementations, an integrated circuit may be mounted on the first pad, and/or a connector header may be mounted on the second pad. Via 120 may serve as, for example, a TX via 130, an RX via 135, and/or a ground via 140, as described below.

In some implementations, via 120 may not extend entirely through PCB 105 from the first surface 110 to the second surface 115. For example, via 120 may extend from the first surface 110 to an intermediate layer of PCB 105 (e.g., positioned between the first surface 110 and the second surface 115), may extend from the second surface 115 to an intermediate layer of PCB 105, or may extend from a first intermediate layer to a second intermediate layer. In some implementations, via 120 may extend from the second surface 115 to an intermediate layer of PCB 105, and via 120 may provide electrical connectivity for a component connected to the intermediate layer.

Solder ball 125 includes a mounting mechanism for mounting an integrated circuit to the first surface 110 of PCB 105. For example, a set of solder balls 125 may be positioned on the first surface 110, and the integrated circuit may be mounted to the first surface 110 using the set of solder balls 125 (e.g., by placing the integrated circuit on the set of solder balls 125 and heating the set of solder balls 125, causing the set of solder balls 125 to melt). In some implementations, the set of solder balls 125 may be arranged in a ball grid array (BGA). In this case, multiple vias 120 may be arranged in an array (e.g., an array of vias 120) according to the BGA pattern of solder balls 125 (e.g., to provide electrical connectivity for an integrated circuit mounted to the first surface 110 using solder balls 125).

A set of solder balls 125 is an example of a mounting mechanism that may be used to mount an integrated circuit to the first surface 110 of PCB 105. In some implementations, other mounting mechanisms may be used, such as a surface-mount technology (SMT) mechanism (e.g., one or more pins, a pin grid array, one or more leads, one or more flat contacts, and/or the like), a through-hole technology (e.g., one or more leads on the integrated circuit may be inserted into vias 120), and/or the like.

TX via 130 serves as a via 120 used for transmission of a signal output by an integrated circuit mounted to the first surface 110 of PCB 105. In some implementations, PCB 105 may include a pair of TX vias 130 used to carry a differential pair of signals transmitted by the integrated circuit (e.g., for differential signaling). A differential pair of signals may refer to two signals that convey information based on a comparison of the two signals. For example, the pair of TX vias 130 may carry a differential pair of signals. A receiver may compare an electrical difference between the pair of signals, rather than the difference between a single signal and ground, thereby mitigating electromagnetic noise. As shown in FIG. 1, PCB 105 may include multiple pairs of TX vias 130 (e.g., arranged according to a particular field pattern for high speed communication links). While TX via 130 is described herein as being a member (e.g., a part) of a TX differential pair, in some implementations, TX via 130 may include a TX via that is not a member of a TX differential pair.

RX via 135 serves as a via 120 used for reception of a signal to be received by an integrated circuit mounted to the first surface 110 of PCB 105. In some implementations, PCB 105 may include a pair of RX vias 135 used to carry a differential pair of signals to be received by the integrated circuit. As shown in FIG. 1, PCB 105 may include multiple pairs of RX vias 135 (e.g., arranged according to a particular field pattern for high speed communication links). While RX via 135 is described herein as being a member (e.g., a part) of an RX differential pair, in some implementations, RX via 135 may include an RX via that is not a member of an RX differential pair.

Ground via 140 includes a via 120 used for electrical grounding of an integrated circuit mounted to the first surface 110 of PCB 105. In some implementations, ground via 140 may be used to carry a ground signal to the integrated circuit, may be used to provide a ground connection for power, and/or the like.

The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single components, or a single components shown in FIG. 1 may be implemented as multiple, distributed components. Additionally, or alternatively, a set of components (e.g., one or more components) shown in FIG. 1 may perform one or more functions described as being performed by another set of components shown in FIG. 1.

FIG. 2 shows a bottom view of example apparatus 100 with a connector header mounted to PCB 105. Apparatus 100 may include one or more of the components described above in connection with FIG. 1, such as PCB 105 with a first surface 110 and a second surface 115, a set of vias 120 (e.g., which may include a set of TX vias 130, a set of RX vias 135, and/or a set of ground vias 140), and/or a set of solder balls 125. Additionally, or alternatively, as shown in FIG. 2, apparatus 100 may include a connector header 205, a set of wires 210, and/or a set of cables 215 that connect to, for example, a transceiver 220.

Connector header 205 includes a component that mechanically supports one or more connectors (e.g., connectors 310, described below in connection with FIG. 3) that provide electrical connectivity for an integrated circuit mounted to a first surface 110 of PCB 105. For example, connector header 205 may include a pin header that mechanically supports one or more pins, a press-fit header that mechanically supports one or more press-fit pins, a pogo pin header that mechanically supports one or more pogo pins, a header that mechanically supports another type of spring-loaded pin, a header that mechanically supports any combination of these types of pins, and/or the like. As shown, connector header 205 may be mounted to a second surface 115 of PCB 105 (e.g., opposite from the first surface 110). When connector header 205 is mounted to the second surface 115, the connector(s) supported by connector header 205 may be mated with corresponding via(s) 120 that extend through the PCB 105 from the second surface 115 to the first surface 110 (e.g., to provide electrical connectivity for an integrated circuit mounted to the first surface 110). Additionally, or alternatively, one or more connector(s) supported by connector header 205 may be mated with one or more corresponding via(s) 120 that do not connect with an integrated circuit mounted to the first surface 110. For example, one or more connector(s) supported by connector header 205 may be mated with one or more corresponding via(s) 120 that extend from the second surface 115 to an intermediate layer of PCB 105.

Wire 210 includes an electrical conductor for carrying electrical signals (e.g., to provide a communication link for an integrated circuit of PCB 105). Wire 210 may be connected to (e.g., attached to, affixed to, etc.) a connector supported by connector header 205. In some implementations, a wire 210 may be connected to a connector, and the connector may be mated with a via 120. In this way, the wire 210, the connector, and the via 120 may provide electrical connectivity for electrical signals transmitted by and/or received by an integrated circuit mounted to the first surface 110 of PCB 105. Additionally, or alternatively, multiple wires 210 may be connected to corresponding multiple connectors, and the multiple connectors may be mated with corresponding multiple vias 120 to increase the quantity of electrical signals that can be concurrently transmitted and/or received by the integrated circuit.

In some implementations, a pair of wires 210 may carry a differential pair of signals. For example, a pair of wires 210 may be connected to a differential pair of TX vias 130 to carry a differential pair of signals transmitted by an integrated circuit mounted to the first surface 110 of PCB 105. Additionally, or alternatively, a pair of wires 210 may be connected to a differential pair of RX vias 135 to carry a differential pair of signals to be received by an integrated circuit mounted to the first surface 110 of PCB 105. In some implementations, a pair of wires 210 that carry a differential pair of signals may be bundled into a cable 215.

Cable 215 includes one or more wires 210 used to carry electrical signals. For example, cable 215 may include a coaxial cable, a twinaxial cable, and/or the like. In some implementations, cable 215 may carry an electrical signal (e.g., on one or more wires 210) from an integrated circuit of PCB 105 to a transceiver 220 or another device that communicates with the integrated circuit (e.g., using high speed communication). Additionally, or alternatively, cable 215 may carry an electrical signal (e.g., on one or more wires 210) from transceiver 220 (or another device) to an integrated circuit of PCB 105. In some implementations, multiple cables 215 may be connected to connector header 205 (e.g., four cables 215, eight cables 215, or the like).

Transceiver 220 includes one or more transmitters and one or more receivers. For example, transceiver 220 may include a quad small form-factor pluggable (QSFP) transceiver or another type of transceiver capable of multiplexing signals received via multiple cables 215 and/or demultiplexing signals for transmission using multiple cables 215. In some implementations, four cables 215 may be connected to transceiver 220 (e.g., two cables for carrying two differential pairs of signals transmitted by an integrated circuit of PCB 105 and two cables for carrying two differential pairs of signals to be received by the integrated circuit). In some implementations, eight cables 215 may be connected to transceiver 220 (e.g., four cables for carrying four differential pairs of signals transmitted by an integrated circuit of PCB 105 and four cables for carrying four differential pairs of signals to be received by the integrated circuit). In some implementations, a different number of cables 215 may be connected to transceiver 220.

By mounting connector header 205 (e.g., a press-fit header) to the second surface 115 of PCB 105 to provide electrical connectivity for one or more components mounted to the first surface 110 of PCB 105, lower attenuation may be achieved using wires and/or cables connected to connectors supported by connector header 205 as compared to using PCB material to carry signals. Furthermore, one or more components used to mitigate attenuation of signals carried by the PCB material may be excluded from PCB 105, thereby increasing available space on PCB 105, reducing a size of PCB 105, reducing a power consumption of PCB 105, simplifying the design of PCB 105, and reducing the cost of PCB 105. Furthermore, mounting connector header 205 to the second surface 115 of PCB 105 allows for more physical space for one or more components and/or other cables connected to the first surface 110 of PCB 105, thereby further increasing available space on PCB 105, reducing a size of PCB 105, reducing a power consumption of PCB 105, simplifying the design of PCB 105, and reducing the cost of PCB 105.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single components, or a single components shown in FIG. 2 may be implemented as multiple, distributed components. Additionally, or alternatively, a set of components (e.g., one or more components) shown in FIG. 2 may perform one or more functions described as being performed by another set of components shown in FIG. 2.

FIG. 3 shows a cross-section view of example apparatus 100 with connector header 205 mounted to PCB 105. Apparatus 100 may include one or more of the components described above in connection with FIG. 1 and/or FIG. 2, such as PCB 105 with a first surface 110 and a second surface 115, a set of vias 120 (e.g., which may include a set of TX vias 130, a set of RX vias 135, and/or a set of ground vias 140), a set of solder balls 125, connector header 205, a set of wires 210, and/or a set of cables 215. Additionally, or alternatively, apparatus 100 may include an integrated circuit 305 (shown as "IC") and/or a set of connectors 310.

Integrated circuit 305 includes one or more electrical components mounted to the first surface 110 of PCB 105. For example, integrated circuit 305 may include an ASIC, an FPGA, a processor, a power supply, a clock, and/or the like. In some implementations, integrated circuit 305 communicates with other components (e.g., on PCB 105 or remote from PCB 105) using high speed communication. Additionally, or alternatively, communications may be transmitted and/or received by integrated circuit 305 using one or more vias 120, one or more connectors 310, and one or more wires 210 (e.g., included in one or more cables 215).

Connector 310 includes a connector, mechanically supported by connector header 205, that provides electrical connectivity for integrated circuit 305. For example, connector 310 may include a pin connector (e.g., a pin), a press-fit connector (e.g., press-fit pin), a pogo connector (e.g., a pogo pin), and/or the like. As shown, when connector header 205 is mounted on the second surface 115 of PCB 105, a set of connectors 310 may be mated with a corresponding set of vias 120 (e.g., may be inserted into the set of vias 120 from the second surface 115).

As shown in FIG. 3, a first wire 210 of a cable 215 may be connected to a first via 120 using a first connector 310, and a second wire 210 of the cable 215 may be connected to a second via 120 using a second connector 310. For example, the first wire 210 may be connected to a first TX via 130 of a pair of TX vias 130 (e.g., using the first connector 310), and the second wire 210 may be connected to a second TX via 130 of the pair of TX vias 130 (e.g., using the second connector 310). As another example, the first wire 210 may be connected to a first RX via 135 of a pair of RX vias 135 (e.g., using the first connector 310), and the second wire 210 may be connected to a second RX via 135 of the pair of RX vias 135 (e.g., using the second connector 310). In either case, the first wire 210 may carry a first signal of a differential pair of signals, and the second wires 210 may carry a second signal of the differential pair of signals.

In some implementations, connector 310 may provide electrical connectivity for integrated circuit 305, such as when connector 310 is mated with a TX via 130 and/or an RX via 135, and when a wire 210 is connected to connector 310 and carries a signal to another device, such as transceiver 220. In some implementations, connector 310 may not provide electrical connectivity for integrated circuit 305, such as when no wire 210 is connected to connector 310. For example, connector 310 may be mated with a ground via 140, and may not be connected to a wire 210. In this case, connector 310 provides mechanical support for mounting connector header 205 to the second surface 115 of PCB 105, but does not provide electrical connectivity for integrated circuit 305.

By mounting connector header 205 (e.g., a press-fit header) to the second surface 115 of PCB 105 to provide electrical connectivity for one or more integrated circuits 305 mounted to the first surface 110 of PCB 105, lower attenuation may be achieved by carrying signals using wires 210 and/or cables 215 connected to connectors 310 as compared to using PCB material to carry the signals. Furthermore, as described elsewhere herein, this configuration may increase available space on PCB 105, may reduce a size of PCB 105, may reduce a power consumption of PCB 105, may simplify the design of PCB 105, and/or may reduce the cost of PCB 105.

Although described herein in relation to differential pairs of signals, connector header 205 may be used to connect to PCB 105 that supports components that transmit and/or receive other types of signals, in some implementations. In other words, connector header 205 is not specific to any type of signals, and may be used with a variety of PCBs 105.

The number and arrangement of components shown in FIG. 3 are provided as an example. In practice, there may be additional components, fewer components, different components, or differently arranged components than those shown in FIG. 3. Furthermore, two or more components shown in FIG. 3 may be implemented within a single components, or a single components shown in FIG. 3 may be implemented as multiple, distributed components. Additionally, or alternatively, a set of components (e.g., one or more components) shown in FIG. 3 may perform one or more functions described as being performed by another set of components shown in FIG. 3.

Implementations described herein include a connector header capable of being mounted to a bottom surface of a PCB to provide connectivity for components mounted to a top surface of the PCB. The connector header may include wires and/or cables that permit high speed communication of PCB components with lower attenuation than typical PCB materials. In this way, components used to mitigate attenuation of PCB materials may be excluded from the PCB, thereby increasing available space on the PCB, reducing PCB size, reducing PCB power consumption, simplifying PCB design, and reducing PCB cost. Furthermore, mounting the connector header to the bottom surface of the PCB reduces physical and/or electrical interference with components and/or other cables connected to the top surface of the PCB, thereby further increasing available space on the PCB, reducing PCB size, reducing PCB power consumption, simplifying PCB design, and reducing PCB cost.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An apparatus, comprising:
a printed circuit board;
an integrated circuit mounted on a first surface of the printed circuit board;
one or more vias that extend through the printed circuit board from the first surface to a second surface of the printed circuit board to provide electrical connectivity for the integrated circuit,
the second surface of the printed circuit board being opposite the first surface of the printed circuit board; and
a pin header that mechanically supports one or more pins that provide electrical connectivity for the integrated circuit,
the pin header being mounted to the second surface of the printed circuit board to mate the one or more pins with the one or more vias to provide electrical connectivity for the integrated circuit, and
the one or more vias including a via that is mated with a pin, of the one or more pins, that does not provide electrical connectivity for the integrated circuit.

2. The apparatus of claim 1, where the pin header is a press-fit header and the one or more pins are one or more press-fit pins.

3. The apparatus of claim 1, further comprising:
one or more wires and/or cables attached to the one or more pins to provide a communication link for the integrated circuit.

4. The apparatus of claim 1,
where the via is a first via,
where the one or more vias further include a second via and a third via that carry a differential pair of signals used for differential signaling, and
where the first via is for electrical grounding.

5. The apparatus of claim 4,
where the pin is a first pin, and
where the apparatus further comprises:
a first wire connected to the second via using a second pin of the one or more pins,
the first wire being to carry a first signal of the differential pair of signals; and
a second wire connected to the third via using a third pin of the one or more pins,
the second wire being to carry a second signal of the differential pair of signals.

6. The apparatus of claim 4,
where the pin is a first pin, and
where the one or more pins further include:
a second pin, mated with the second via, that provides electrical connectivity for the integrated circuit; and
a third pin, mated with the third via, that provides electrical connectivity for the integrated circuit.

7. The apparatus of claim 1, where the pin provides mechanical support for mounting the pin header to the second surface of the printed circuit board.

8. The apparatus of claim 1, where the one or more vias include a plurality of vias arranged in an array according to a ball grid array pattern of solder balls positioned on the first surface of the printed circuit board.

9. An apparatus, comprising:
a printed circuit board having a first surface;
an array of vias that extend through the printed circuit board from the first surface to a second surface of the printed circuit board,
the array of vias to provide electrical connectivity for an integrated circuit to be mounted to the first surface of the printed circuit board; and
a connector header that mechanically supports a plurality of connectors,
the connector header being mounted to the second surface of the printed circuit board to mate the plurality of connectors with a corresponding plurality of vias, included in the array of vias, from the second surface of the printed circuit board,
at least one of the plurality of connectors to provide electrical connectivity for the integrated circuit.

10. The apparatus of claim 9, where the connector header is a press-fit header and the plurality of connectors are a plurality of press-fit pins.

11. The apparatus of claim 9, where the plurality of vias includes:
a first set of vias to carry a first differential pair of signals for transmission, and
a second set of vias to carry a second differential pair of signals for reception.

12. The apparatus of claim 11, further comprising:
a first cable connected to the first set of vias using a first set of connectors of the plurality of connectors,
the first cable to carry the first differential pair of signals; and
a second cable connected to the second set of vias using a second set of connectors of the plurality of connectors,
the second cable to carry the second differential pair of signals.

13. The apparatus of claim 9, where the plurality of vias includes:
a set of vias for electrical grounding.

14. The apparatus of claim 13, where the set of vias are mated with a set of connectors, of the plurality of connectors, that provide mechanical support for mounting the connector header to the second surface of the printed circuit board and that do not provide electrical connectivity for the integrated circuit.

15. An apparatus, comprising:
a printed circuit board having a first surface for mounting an integrated circuit and a second surface opposite the first surface;
an array of vias to provide electrical connectivity for the integrated circuit,
the array of vias extending through the printed circuit board from the first surface to the second surface; and
a connector header that mechanically supports a plurality of connectors,
the connector header being mounted to the second surface of the printed circuit board, the plurality of connectors being mated with the array of vias to provide electrical connectivity for the integrated circuit.

16. The apparatus of claim 15, where the connector header is a press-fit header and the plurality of connectors are a plurality of press-fit pins.

17. The apparatus of claim 15, where the connector header is a pogo pin header and the plurality of connectors are a plurality of pogo pins.

18. The apparatus of claim 15, where the array of vias includes:
  a first pair of vias to carry a first differential pair of signals for transmission, and
  a second pair of vias to carry a second differential pair of signals for reception.

19. The apparatus of claim 18, further comprising:
  a first cable connected to the first pair of vias using a first pair of connectors of the plurality of connectors,
    the first cable to carry the first differential pair of signals; and
  a second cable connected to the second pair of vias using a second pair of connectors of the plurality of connectors,
    the second cable to carry the second differential pair of signals.

20. The apparatus of claim 19, where the first cable includes a first wire and a second wire to carry the first differential pair of signals, and
  where the second cable includes a third wire and a fourth wire to carry the second differential pair of signals.

* * * * *